(12) United States Patent
Yamazaki

(10) Patent No.: US 7,843,986 B2
(45) Date of Patent: Nov. 30, 2010

(54) PLANAR LIGHTWAVE CIRCUIT AND TUNABLE LASER DEVICE HAVING THE SAME

(75) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 27 days.

(21) Appl. No.: 12/465,062

(22) Filed: May 13, 2009

(65) Prior Publication Data

US 2009/0285251 A1   Nov. 19, 2009

(30) Foreign Application Priority Data

May 16, 2008   (JP)   ............... 2008-130103

(51) Int. Cl.
    *H01S 3/14* (2006.01)
(52) U.S. Cl. .......................... 372/94; 385/39
(58) Field of Classification Search .............. 372/38.07, 372/94, 97, 34
    See application file for complete search history.

(56) References Cited

U.S. PATENT DOCUMENTS

| | | | |
|---|---|---|---|
| 7,187,827 B2 * | 3/2007 | Montgomery et al. | ......... 385/39 |
| 7,389,028 B2 * | 6/2008 | Suzuki et al. | ................ 385/50 |
| 7,639,723 B2 * | 12/2009 | Yamazaki | .................... 372/94 |
| 2004/0032886 A1 | 2/2004 | Taghavi-Larigani et al. | |
| 2006/0198415 A1 | 9/2006 | Yamazaki | |

FOREIGN PATENT DOCUMENTS

| | | |
|---|---|---|
| JP | 1993181028 A | 7/1993 |
| JP | 2000012978 A | 1/2000 |
| JP | 2006196554 A | 7/2006 |
| JP | 2006245346 A | 9/2006 |

OTHER PUBLICATIONS

German Office Action for DE 10 2009 021 043.1-54 issued on Dec. 16, 2009.
C. K. Madsen et al., "Integrated All-Pass Filters for Tunable Dispersion and Dispersion Slope Compensation", IEEE Photonics Technology Letters, vol. 11, No. 12, Dec. 1999, pp. 1623-1625.
K. Jinguji et al., "Two-Port Optical Wavelength Circuits Composed of Cascaded Mach-Zehnder Interferometers with Point-Symmetrical Configurations", Journal of Lightwave Technology, vol. 14, No. 10, Oct. 1996, p. 2301-2310.

* cited by examiner

*Primary Examiner*—Minsun Harvey
*Assistant Examiner*—Tuan N. Nguyen

(57) ABSTRACT

To prevent the property of an optical filter from being changed even if there is a change in a gap of directional couplers generated due to variations in manufacturing conditions so as to improve the yield. A tunable laser device includes a PLC and an SOA. The PLC includes: optical waveguides; an optical filter; a loop mirror; thin-film heaters; and asymmetrical MZIs. Optical coupling parts within the PLC are formed with the asymmetrical MZIs, so that there is no change generated in the property of the optical filter even if there is a change generated in a gap of the directional couplers due to variations in the manufacturing conditions. Therefore, the yield can be improved.

8 Claims, 4 Drawing Sheets

PLANAR LIGHTWAVE CIRCUIT AND TUNABLE LASER DEVICE HAVING THE SAME

CROSS-REFERENCE TO RELATED APPLICATION

This application is based upon and claims the benefit of priority from Japanese patent application No. 2008-130103, filed on May 16, 2008, the disclosure of which is incorporated herein in its entirety by reference.

BACKGROUND OF THE INVENTION

1. Field of the Invention

The present invention relates to a planar lightwave circuit used for performing optical communications of a WDM (Wavelength Division Multiplexing) transmission system, for example, and to a tunable laser device having the planar lightwave circuit. Hereinafter, the "planar lightwave circuit" is simply referred to as "PLC", a "semiconductor optical amplifier" as "SOA", and a "Mach-Zehnder interferometer" as "MZI", respectively.

2. Description of the Related Art

In the optical communications, there has been active adoption of a WDM transmission system which achieves high-speed optical communications through conducting transmissions with a single optical fiber by multiplexing a plurality of optical signals of different wavelengths, in order to enable efficient utilization of the optical fiber. Further, there has also been a spread of a high-density WDM (DWDM: Dense WDM) transmission system which enables high-speed transmissions by multiplexing optical signals of several tens of different wavelengths.

Further, ROADM (Reconfigurable Optical Add/Drop Multiplexer) which adds/drops optical signals of an arbitrary wavelength at each node has been studied for being put into practical use. Adoption of this ROADM system makes it possible to switch optical paths by changing the wavelengths, in addition to expansion in the transmission capacity achieved by multiplexing the wavelengths. This results in drastic improvements in the versatility in use of optical networks. In this case, light sources corresponding to respective wavelengths are required for the optical communication network system.

A tunable laser device shown in FIG. 4 is known as a light source for a WDM transmission system (see Japanese Unexamined Patent Publication 2006-245346 (Patent Document 1), for example) FIG. 4A is a plan view showing a tunable laser device related to the present invention. FIG. 4B is a plan view which shows an enlarged view of a directional coupler shown in FIG. 4A. Explanations will be provided hereinafter by referring to the drawings.

A tunable laser device 70 includes: an optical filter 72 formed on a PLC 71; an SOA 73 which supplies light to the optical filter 72; a high-reflective coating 74 which returns light transmitted through the optical filter 72 to the SOA 73 via the optical filter 72; and optical waveguides 75 and 76 which are formed on the PLC 71 to connect the SOA 73, the optical filter 72, and the high-reflective mirror 74. The optical filter 72 is configured with ring resonators 77, 78 having different optical lengths from each other, and an optical waveguide 79 which connects the ring resonators 77, 78. Thin-film heaters 80a, 80b, 81a, and 81b for changing the phase of the light transmitted through the ring resonators 77, 78 are provided on the ring resonators 77, 78. To change the phase of the light is to change the wavelength of the light.

The optical waveguide 75 and the ring resonator 77 are optically coupled via a directional coupler 91, and the ring resonator 77 and the optical waveguide 79 are optically coupled via a directional coupler 92. Further, the optical waveguide 79 and the ring resonator 78 are optically coupled via a directional coupler 93, and the ring resonator 78 and the optical waveguide 76 are optically coupled via a directional coupler 94.

While FIG. 4B shows only the directional coupler 91, the other directional couplers 92-94 have the same structure as well. The directional coupler 91 is configured with two optical waveguides 95 and 96, and it exhibits a property that is determined depending on a gap g provided therebetween and a coupling length l. The optical waveguide 95 is a part of the optical waveguide 75, and the optical waveguide 96 is a part of the ring resonator 77.

As described, the tunable laser device 70 is in a structure in which the PLC 71 forms the optical filter 72, and the SOA 73 is directly mounted on the PLC 71. The two ring resonators 77 and 78 formed on the PLC 71 have a slightly different circumference from each other. Vernier effect occurs due to the difference in the circumferences, so that output light 82 of a wide tunable wavelength range can be obtained through controlling on/off of the thin-film heaters 80a, etc.

However, there are following issues in the tunable laser device 70 shown in FIG. 4.

When the manufacturing condition for the PLC 71 fluctuates, the property of the directional couplers 91-94 fluctuates as well. Accordingly, the wavelength transmittance property of the optical filter 72 greatly varies, so that the yield of the tunable laser device 70 is deteriorated greatly. This is because the directional couplers 91-94 are formed with the optical waveguides 95 and 96 arranged in parallel with the extremely narrow gap g of about 1.5 μm, so that the coupling property of the directional couplers 91-94 becomes greatly changed even with a change of 0.1 μm in the gap g.

SUMMARY OF THE INVENTION

It is therefore an exemplary object of the present invention to provide a PLC and a tunable laser device, with which no change is generated in the property of the optical filter even if there is a change in the gap in the directional couplers. Therefore, the yield thereof can be improved.

The PLC according to an exemplary aspect of the invention includes: a first optical waveguide and a second optical waveguide; an optical filter formed by coupling a plurality of ring resonators of different optical path lengths to output and input light via the first optical waveguide; a light-reflecting part which returns the light transmitted through the optical filter to the optical filter via the second optical waveguide; a phase shifter to change a phase of light that transmits through the optical filter; and a plurality of optical coupling parts which optically couple the plurality of ring resonators to each other and optically couple the first optical waveguide, the optical filter, and the second optical waveguide, wherein at least one of the optical coupling parts is formed with an asymmetrical MZI.

The tunable laser device according to another exemplary aspect of the invention includes: the PLC according to the present invention; and a light-supplying part for supplying light to the optical filter via the first optical waveguide of the planar lightwave circuit.

DETAILED DESCRIPTION OF THE EXEMPLARY EMBODIMENTS

Hereinafter, exemplary embodiments of the invention will be described in detail by referring to the accompanying drawings.

Figure 1:
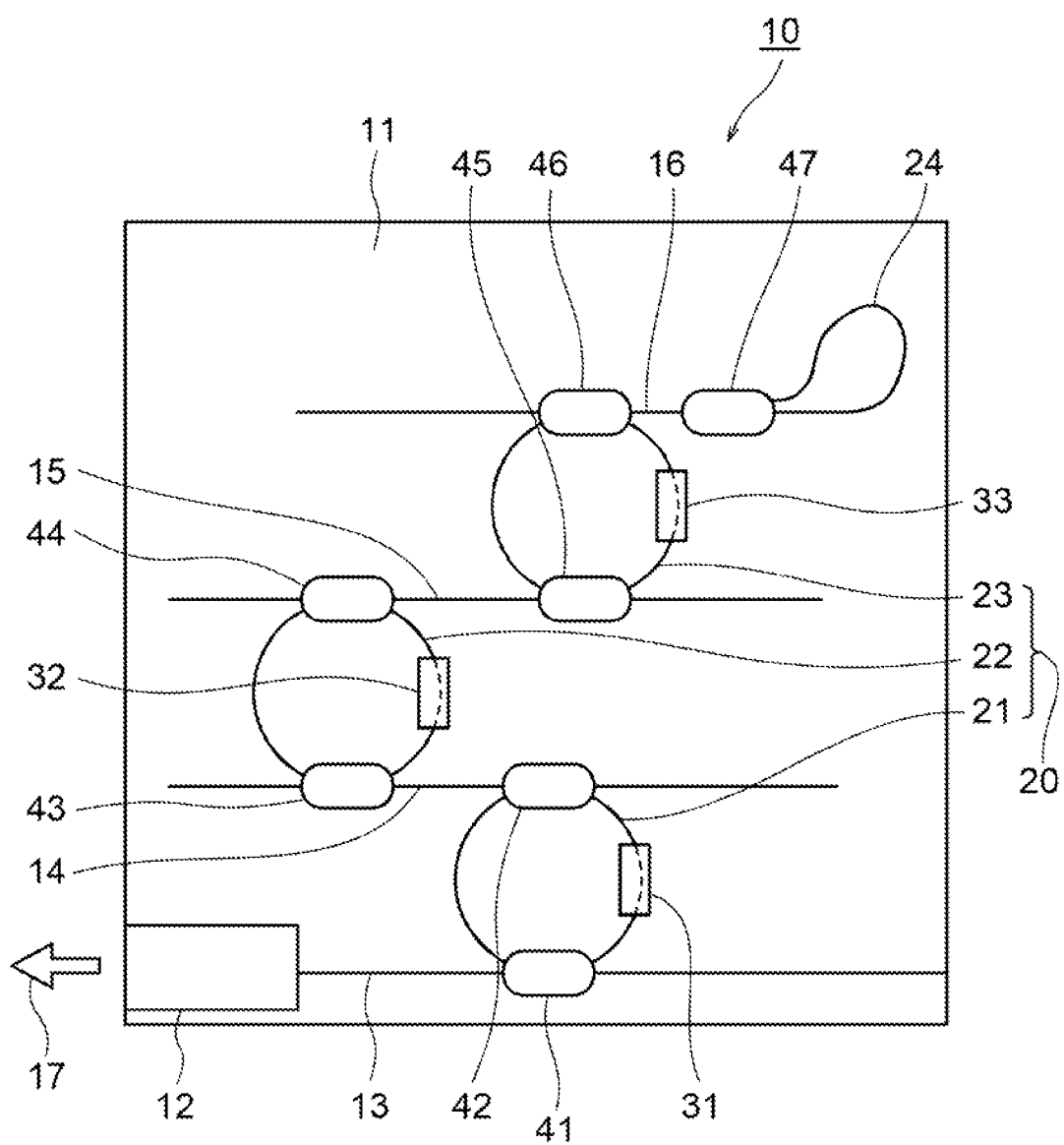
FIG. 1 is a plan view showing a PLC and a tunable laser device according to a first exemplary embodiment of the invention.
Figure 2:
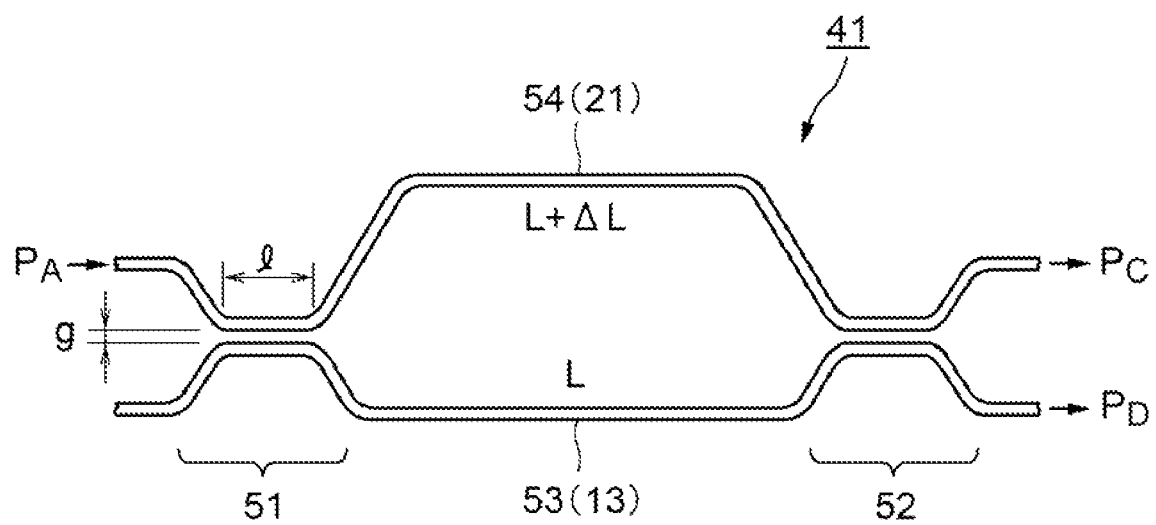
FIG. 2 is an enlarged plan view of an asymmetrical MZI shown in FIG. 1.

FIG. 1 is a plan view showing a PLC and a tunable laser device according to a first exemplary embodiment of the invention, and FIG. 2 is an enlarged plan view of an asymmetrical MZI shown in FIG. 1. Hereinafter, explanations are provided by referring to the drawings.

A tunable laser device 10 includes a PLC 11 and an SOA 12 as a light-supplying part. The PLC 11 basically includes: an optical waveguide 13 as a first optical waveguide; an optical waveguide 16 as a second optical waveguide; an optical filter 20; a loop mirror 24 as a light-reflecting part; thin-film heaters 31, 32, and 33 as phase shifters; and asymmetrical MZIs 41, 42, 43, 44, 45, and 46 as optical coupling parts.

The SOA 12 is loaded on the PLC 11, and it supplies light to the optical filter 20 via the optical waveguide 13. The optical filter 20 is a multiplex ring resonator that is formed by coupling three ring resonators 21, 22, and 23 with different optical paths, and it outputs and inputs light via the optical waveguide 13. The loop mirror 24 returns the light transmitted through the optical filter 20 to the optical filter 20 via the optical waveguide 16. The thin-film heaters 31, 32, and 33 change the phase of the light transmitted through the optical filter 20 by changing the temperature of the optical waveguides which forms the ring resonators 21-23. The asymmetrical MZIs 41-46 optically couple the ring resonators 21-23, and optically couples the optical waveguide 13, the optical filter 20, and the optical waveguide 16.

The ring resonators 21, 22, and 23 are optically coupled to each other via the optical waveguides 14, 15 and the asymmetrical MZIs 42-45. The optical waveguide 13 and the ring resonator 21 are optically coupled via the asymmetrical MZI 41. The ring resonator 21 and the optical waveguide 14 are optically coupled via the asymmetrical MZI 42. The optical waveguide 14 and the ring resonator 22 are optically coupled via the asymmetrical MZI 43. The ring resonator 22 and the optical waveguide 15 are optically coupled via the asymmetrical MZI 44. The optical waveguide 15 and the ring resonator 23 are optically coupled via the asymmetrical MZI 45. The ring resonator 23 and the optical waveguide 16 are optically coupled via the asymmetrical MZI 46. The loop mirror 24 is configured with an optical waveguide and provided with an optical coupling part as in the case of the typically-used type. The optical coupling part is formed with an asymmetrical MZI 47.

While FIG. 2 only shows the asymmetrical MZI 41, the other asymmetrical MZI 42-47 have the same structure as that of the asymmetrical MZI 41. The asymmetrical MZI 41 has two directional optical couplers 51, 52, and two optical waveguides 53, 54 sandwiched between the directional couplers 51, 52. The optical waveguides 53 and 54 have a different wavelength from each other, and an optical path length difference is $\Delta L$. The directional coupler 51 optically couples one end of the optical waveguide 53 and one end of the optical waveguide 54, and the directional coupler 52 optically couples the other end of the optical waveguide 53 and the other end of the optical waveguide 54. The directional couplers 51 and 52 are in a same shape and same size. The optical waveguide 53 is a part of the optical waveguide 13, and the optical waveguide 54 is a part of the ring resonator 21.

The PLC 11 is structured by depositing an oxide film on a silicon substrate, and the refractive index of a core part is increased to form an embedded-type optical waveguide. The optical waveguides 13-16, the ring resonators 21-23, the loop mirror 24, the asymmetrical MZI 41-47, and the like are formed by the embedded-type optical waveguides.

The optical filter 20 has a structure in which the ring resonators 21-23 are connected in series. The ring resonators 21-23 have a different optical path length from each other (a product of the refractive index of a medium through which light propagates and geometrical length). The optical filter 20 multiplexes and de-multiplexes the light of resonance wavelengths only when the ring resonators 21-23 resonate simultaneously, and obtains a large FSR (Free Spectral Range) by the Vernier effect.

The "Vernier effect" is an phenomenon that occurs when a plurality of resonators with different optical path lengths are combined, in which the resonance frequencies of respective resonators with shifted peak cycles overlap with each other at the frequency of their least common multiple. A multiplexed light resonator obtained by combining a plurality of resonators functions in such a manner that the apparent FSR becomes the frequency of the least common multiple of the resonance frequencies of respective resonators through utilizing the Vernier effect. This makes it possible to control the property of the frequencies in a wider range than that of a single resonator.

The tunable laser device 10 is structured to perform a single-mode oscillation by selecting a resonance mode through utilizing the wavelength transmittance property of each drop port of the ring resonators 21-23. Through designing it to have slightly different optical path length for each of the ring resonators 21-23, the resonance wavelengths of the optical filter 20 meet at only one consistent point even in a wide wavelength range of about several tens nm. This makes it possible to generate the single mode oscillation with the consistent wavelength.

For example, the FSR of the ring resonator 21 is fixed to ITU (International Telecommunication Union)-grid. With this, the resonance wavelength of the optical filter 20 (the wavelength of the least minimum multiple of each resonance wavelength of the ring resonators 21-23) can be made as the wavelength on the ITU-grid. In this case, the ring resonator 21 may be used for fixing the FSR to the ITU-grid, the ring resonator 22 may be used for fine adjustment, and the ring resonator 23 may be used for rough adjustment.

The thin-film heaters 31-33 are made with aluminum films which are deposited by corresponding to the respective positions of the ring-type optical waveguides of the ring resonators 21-23. The ring-type optical waveguides of the ring resonators 21-23 are formed with glass or a compound semiconductor, and the refractive index thereof changes according to a change in the temperature. Therefore, the thin-film heaters 31-33 apply heat to the ring-type optical waveguides of the ring resonators 21-23 to individually change the refractive indexes thereof. Thus, it is possible to change the resonance wavelength of the optical filter 20 through variably controlling the optical path lengths of the ring resonators 21-23 simultaneously.

The SOA 12 has a non-reflective coating applied on one end face thereof, and it is mounted on the PLC 11. The optical waveguide 13 formed on the PLC 11 is coupled to the non-reflective coating side of the SOA 12. The three-stage ring resonators 21-23 formed with the optical waveguides are employed as the optical filter 20 for selecting the wavelength. The light passed through the three-stage ring resonators 21-23 is returned by the loop mirror 24, which passes through the three-stage ring resonators 21-23 again to go back to the SOA 12. Thereby, a laser resonator is formed between the non-reflective coating face of the SOA 12 and the loop mirror 24, which generates a laser oscillation so that oscillation light (output light 17) is outputted from the low-reflective coating face of the SOA 12. Thereby, a specific wavelength as a target is selected, which makes it possible to perform a laser oscillating action with a desired wavelength.

Not the typical directional couplers but the asymmetrical MZI 41-47 are employed at the optical coupling parts of the ring resonators 21-23 and the loop mirror 24. With this, as will be described later, even if the gap g in the directional couplers 51 and 52 configuring the asymmetrical MZI 41-47 fluctuates due to variations in the manufacturing conditions, it is possible to expand an element manufacturing tolerance (margin of error) since a branching ratio change is small.

The SOA 12 is directly mounted on the PLC 11 by using a passive alignment technique. The passive alignment technique is a mounting method which determines positions by using a mark pattern formed on the PLC 11 and a mark pattern formed on the SOA 12. Thus, it is possible to achieve a large improvement in the cost and the lead time for manufacturing optical modules, since it is unnecessary to perform the optical axis adjustment which is conventionally performed when manufacturing the optical modules. It is also possible to employ a form in which the SOA 12 is connected directly to the PLC 11 without being mounted thereon.

Figure 4A:
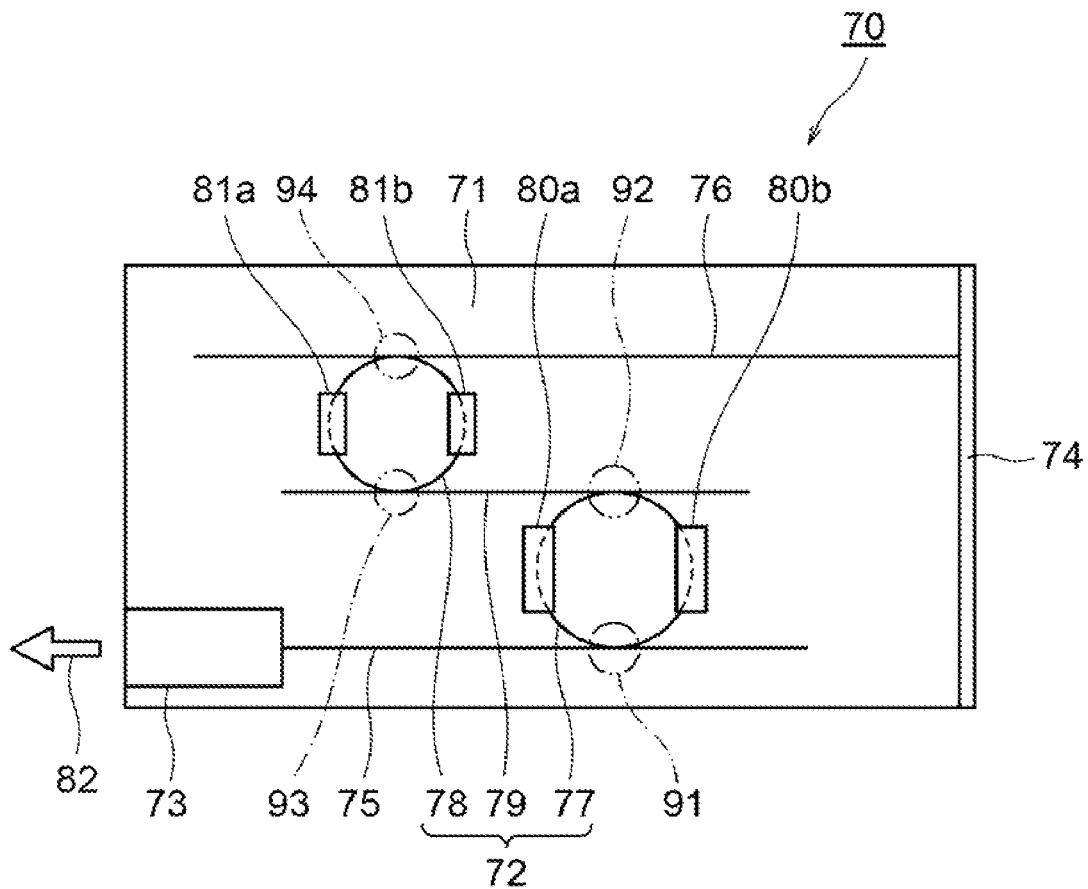
FIG. 4A is a plan view showing a tunable laser device related to the present invention.
Figure 4B:
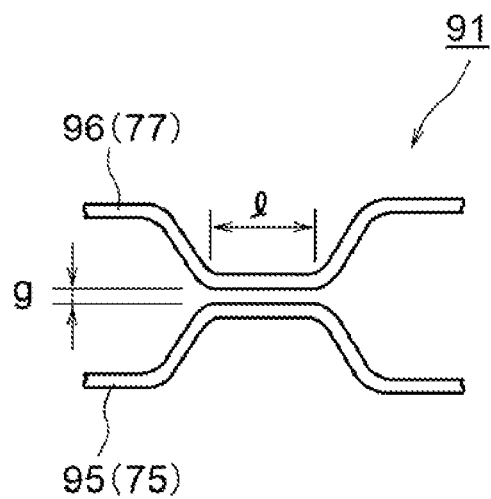
FIG. 4B is an enlarged plan view of a directional coupler shown in FIG. 4A.

Next, the characteristic of the tunable laser device 10 will be described in more details. The ring resonators 21-23 and the loop mirror 24 are optically coupled by the asymmetrical MZIs 41-47. The directional couplers 51 and 52 of the asymmetrical MZI 41-47 are formed with the two optical waveguides 53 and 54 with a narrow gap g. The gap g is about 1.5 μm, for example. Thus, the filter property of a tunable laser device 70 shown in FIG. 4 fluctuates greatly even with a change of 0.1 μm in the gap g caused due to variations in the manufacturing conditions. This exemplary embodiment provides a structure which is not affected by the change in the gap in the directional couplers generated due to variations in the processes or the like. For that, light is branched not only with the use of the directional couplers but also with the use of the asymmetrical MZI 41-47 that are configured with the two directional couplers 51 and 52.

This will be described in detail based on the asymmetrical MZI 41 shown in FIG. 2. Provided that a phase difference generated by the phase shifters (thin-film heaters 31-33) is 2ϕ, a coupling efficiency of the directional coupler 51 in a phase-expression is $\theta_1$, and a coupling efficiency of the directional coupler 52 is $\theta_2$, a coupling efficiency R of the asymmetrical MZI 41 can be expressed as in Expression (1) (see Expression (8) depicted in p. 2306 of Non-Patent Document 1 (K. Jinguji et al., J. Lightwave Technology, Vol. 14, pp. 2301-2310, 1996), for example).

$$R = \cos^2(\phi)\sin^2(\theta_1+\theta_2) + \sin^2(\phi)\sin^2(\theta_1-\theta_2) \qquad (1)$$

Assuming here that an input power supplied as in FIG. 2 is $P_A$ and output powers in that case are $P_C$, $P_D$, the coupling efficiency R can be expressed as in Expression (2).

$$R = P_D/(P_C+P_D) \qquad (2)$$

The first term of Expression (1) can be made extremely smaller than the second term through properly selecting the phase difference 2ϕ generated by the thin-film heaters 31-33 at the time of design. In that case, the second term may simply need to be taken into consideration for the fluctuation of the coupling efficiency R. Note that "ϕ" is the amount that is determined depending on the length of the thin-film heaters 31-33, and it is determined depending on the accuracy of the mask used for patterning. Thus, it does not fluctuate even if there are variations in the manufacturing conditions. "$\theta_1$" and "$\theta_2$" are functions of the gap g in the directional couplers 51, 52 and the length l. The length l is determined depending on the accuracy of the mask, so that it does not fluctuate even if there are variations in the manufacturing conditions. Therefore, it is the variation in the gap g in the directional couplers 51 and 52, which is to be considered at a stage of designing. The gap g changes depending on the manufacturing conditions such as etching, embedding of upper cladding, and the like.

The two directional couplers 51 and 52 are manufactured simultaneously with the same condition, so that fluctuations in the gap g of the both couplers become almost the same. Particularly, when design values of the gap g in the directional couplers 51 and 52 are equal and the both couplers are close to each other, the difference in the manufacturing conditions of the both couplers becomes extremely small. Thus, the fluctuations in the gap g of the both couplers become extremely close to equal, so that a change in "$(\theta_1-\theta_2)$" of the second term in Expression (1) becomes small. Thereby, it is possible to form the ring resonators 21-23 with a small branching ratio change, even if there is a change in the gap g of the directional couplers 51 and 52. The branching ratio can be adjusted with high precision by controlling the both arm lengths of the asymmetrical MZIs 41-47 (i.e., the optical path lengths L and L+ΔL of the optical waveguides 53 and 54).

As described, through employing the asymmetrical MZIs 41-47 into the ring resonators 21-23, a fluctuation in the filter property can be avoided even if there is a fluctuation in the gap g of the directional couplers 51 and 52 caused due to variations in the manufacturing conditions. This makes it possible to achieve the optical filter 20 for a tunable laser device with a high manufacture tolerance. In addition, there is also an advantage of being able to perform a wide-range tuning action stably, since the branching ratio is controlled not by the coupling state of the two optical waveguides as in the conventional cases but by the optical path length difference ΔL of the asymmetrical MZIs 41-47.

Therefore, it is possible to improve the yield with the PLC 11 and the tunable laser device 10 of the exemplary embodiment, since there is no change in the property of the optical filter 20 generated even if there is a change in the gap g of the directional couplers 51 and 52 caused due to fluctuations in the manufacturing conditions, because the optical coupling parts within the PLC 11 are formed with the asymmetrical Mach-Zehnder interferometers 41-47.

While it is desirable to form all the optical coupling parts with the asymmetrical MZIs 41-47, it is also fine to form at least one of those with the asymmetrical MZI and to form the others with the directional couplers, for example. The light reflecting part is not limited to be the loop mirror 24 but may be a high-reflective coating, for example. The optical filter is not limited to be formed with the three-stage ring resonators 21-23 but may be formed with two-stage ring resonators, or, four or more-stage ring resonators. Each of the ring resonators 21-23 may be coupled only via the asymmetrical MZIs 42-45 without using the optical waveguides 14 and 15. The phase shifters are not limited to be the thin-film heaters 31-33 but may be formed in a structure in which the refractive index of the optical waveguides is changed through applying distortions, electric current insertion used in a compound semiconductor integrated optical device, etc. The light supplying part is not limited to be the SOA 12. It is possible to use a laser diode chip as well.

As described above, with the tunable laser device 10 of this to exemplary embodiment, a high manufacturing tolerance can be achieved. This makes it possible to improve the yield and throughput as well as a wide-range tuning action. In addition, unlike the typical tunable laser device of an external-mirror type, there is no movable part provided in the device of the exemplary embodiment. Thus, a high vibration impact characteristic can be achieved in addition to a high reliability. Furthermore, since the wavelength tuning is performed by controlling the power supplied to the thin-film heaters, the tunable laser device of the exemplary embodiment exhibits an extremely smaller secular change in the property compared to such a type with which an electric current is inserted to the semiconductor waveguides.

In the present invention, the optical couplers within the PLC are formed with asymmetrical MZIs. Thus, as an exemplary advantage according to the invention, there is no change generated in the property of the optical filter, even if there is a change generated in the gap in the directional couplers due to variations in manufacturing conditions. Therefore, the yield can be improved.

Figure 3:
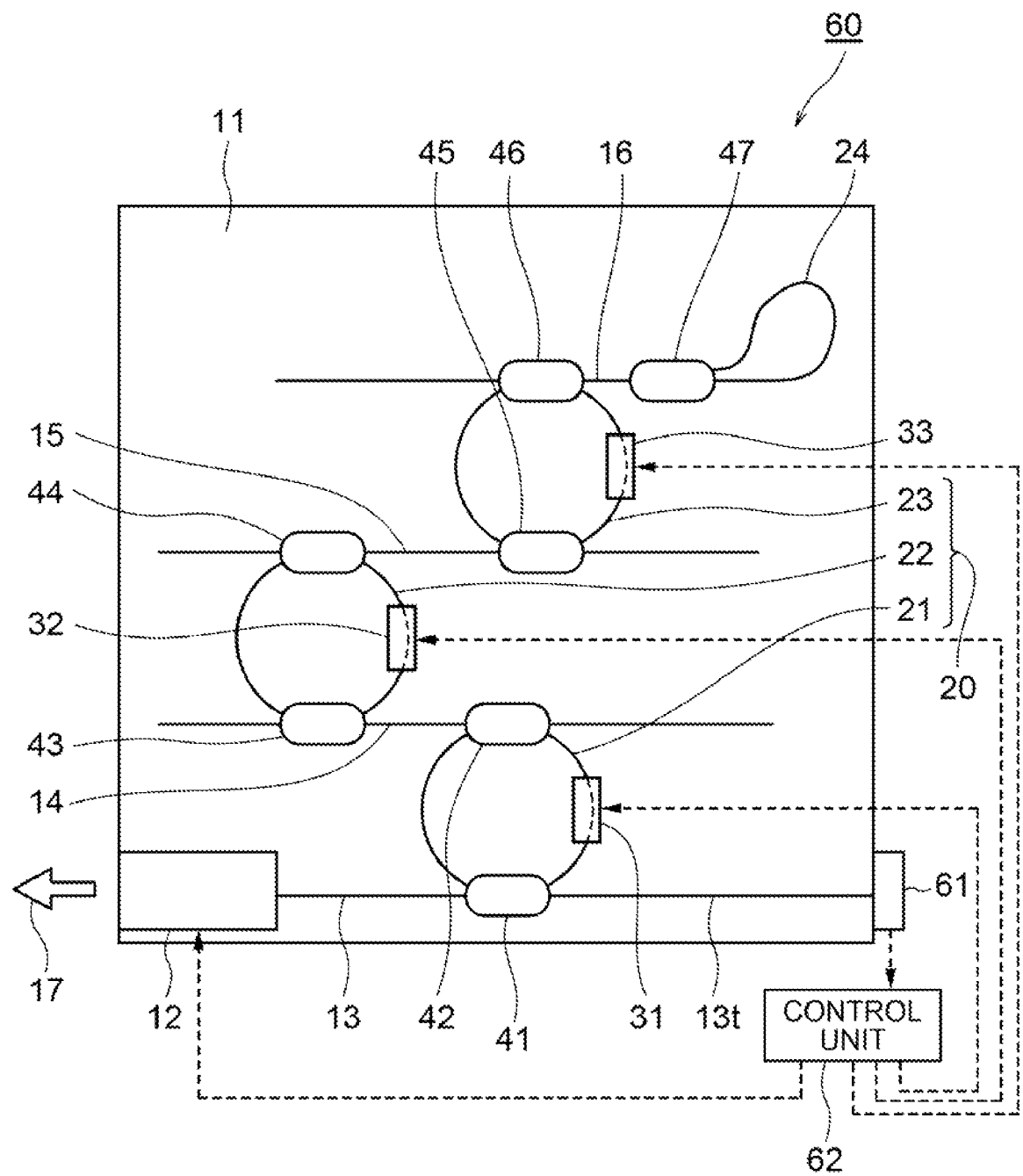
FIG. 3 is a plan view showing a PLC and a tunable laser device according to a second exemplary embodiment of the invention.

FIG. 3 is a plan view showing a PLC and a tunable laser device according to a second exemplary embodiment of the invention. Explanations will be provided hereinafter by referring to the drawing. Same reference numerals are applied to the same components as those of FIG. 1, and explanations thereof are omitted.

A tunable laser device 60 of this exemplary embodiment is obtained by further adding, to the tunable laser device 10 of the first exemplary embodiment shown in FIG. 1, a light-receiving element 61 for detecting light from the ring resonator 21 via a through port 13*t*, and a control unit 62 for adjusting an electric current amount supplied to the thin-film heaters 31-33 in such a manner that the light amount detected at the light-receiving element 61 becomes small.

The light-receiving element 61 is a photodiode, for example. The control unit 62 is configured with a microcomputer, an AD converter, a DA converter, a power-supplying transistor, and the like, and it also has a function of adjusting the electric current amount supplied to the SOA 12. That is, the control unit 62 receives an input of a signal indicating a prescribed wavelength from another computer or the like, and adjusts the electric current amount supplied to the thin-film heaters 31-33 and the SOA 12 so that the output 17 of that wavelength can be obtained.

The light amount detected at the light-receiving element 61 via the through port 13*t* becomes the minimum with the resonance wavelength of the optical filter 20. Therefore, the resonance wavelength of the optical filter 20 can be obtained by adjusting the electric current amount supplied to the thin-film heaters 31-33 in such a manner that the light amount detected at the light-receiving element 61 becomes small. The light-receiving element 61 may also be provided to the through ports of other ring resonators. In that case, the control unit 62 may adjust the electric current amount supplied to the thin-film heaters 31-33 in such a manner that the sum of the light amounts detected at the two or more light-receiving elements becomes small.

Other structures, operations, and effects of the tunable laser device 60 are the same as those of the tunable laser device 10 of the first exemplary embodiment (FIG. 1).

While the present invention has been described above by referring to each of the exemplary embodiments, the present invention is not limited to those exemplary embodiments. Various changes and modifications that occur to those skilled in the art may be applied to the structures and details of the present invention. Further, it is to be understood that the present invention includes combinations of a part of or the whole part of the structures described in each of the exemplary embodiments.

What is claimed is:

1. A tunable laser device, comprising:
 planar lightwave circuit; and
 a light-supplying part for supplying light to the optical filter via the first optical waveguide of the planar lightwave circuit;
 wherein said planar lightwave circuit, comprising:
 a first optical waveguide and a second optical waveguide;
 an optical filter formed by coupling a plurality of ring resonators of different optical path lengths to output and input light via the first optical waveguide;
 a light reflecting part which returns the light transmitted through the optical filter to the optical filter via the second optical waveguide;
 a phase shifter to change a phase of light that transmits through the optical filter; and
 a plurality of optical coupling parts which optically couple the plurality of ring resonators to each other and optically couple the first optical waveguide, the optical filter, and the second optical waveguide,
 wherein at least one of the optical coupling parts is formed with an asymmetrical Mach-Zehnder interferometer and the phase shifter is a thin-film heater which changes a temperature of the optical waveguides which configure the ring resonators,
 wherein said tunable laser device, further comprising,
 a light-receiving element which detects light from at least one of the plurality of ring resonators via a through port; and
 a control unit which adjusts an electric current amount supplied to the phase shifter in such a manner that a light amount detected at the light-receiving element becomes small.

2. The planar lightwave circuit as claimed in claim 1, wherein the asymmetrical Mach-Zehnder interferometer has two optical waveguides of different optical path lengths, and two directional couplers which optically couple given ends of the two optical waveguides to each other and other ends of two optical waveguides to each other, respectively.

3. The planar lightwave circuit as claimed in claim 1, wherein the light reflective part is a loop mirror having an optical coupling part configured with an optical waveguide, and the asymmetrical Mach-Zehnder interferometer is also used for the optical coupling part.

4. The tunable laser device as claimed in claim 1, wherein the light-supplying part is a semiconductor light amplifier mounted on the planar lightwave circuit.

5. A tunable laser device, comprising:

a planar lightwave circuit; and light-supplying means for supplying light to the optical filter via the first optical waveguide of the planar lightwave circuit;

wherein said planar lightwave circuit, comprising:

a first optical waveguide and a second optical waveguide;

optical filter means formed by coupling a plurality of ring resonators of different optical path lengths for outputting and inputting light via the first optical waveguide;

light reflecting means for returning the light transmitted through the optical filter means to the optical filter means for via the second optical waveguide;

phase shifting means for changing a phase of light that transmits through the optical filter means; and a plurality of optical coupling means for optically coupling the plurality of ring resonators to each other and optically coupling the first optical waveguide, the optical filter means, and the second optical waveguide, wherein at least one of the optical coupling means is formed with an asymmetrical Mach-Zehnder interferometer and the phase shifting means is a thin-film heater which changes a temperature of the optical waveguides which configure the ring resonators, wherein said tunable laser device, further comprising, light-receiving means for detecting light from at least one of the plurality of ring resonators via a through port; and control means for adjusting an electric current amount supplied to the phase shifter in such a manner that a light amount detected at the light-receiving means becomes small.

6. The tunable laser device as claimed in claim 5, wherein the light-supplying means is a semiconductor light amplifier mounted on the planar lightwave circuit.

7. The planar lightwave circuit as claimed in claim 5, wherein the asymmetrical Mach-Zehnder interferometer has two optical waveguides of different optical path lengths, and two directional couplers which optically couple given ends of the two optical waveguides to each other and other ends of two optical waveguides to each other, respectively.

8. The planar lightwave circuit as claimed in claim 5, wherein the light reflective means is a loop mirror having an optical coupling means configured with an optical waveguide, and the asymmetrical Mach-Zehnder interferometer is also used for the optical coupling means.

* * * * *